(12) United States Patent
Leigh et al.

(10) Patent No.: US 9,320,159 B2
(45) Date of Patent: Apr. 19, 2016

(54) COOLING A SECONDARY COMPONENT BY DIVERTING AIRFLOW USING AN AIR CHANNEL ASSOCIATED WITH A THERMAL DISSIPATION DEVICE THAT COOLS A PRIMARY COMPONENT

(75) Inventors: Kevin Leigh, Houston, TX (US); Arlen L. Roesner, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 283 days.

(21) Appl. No.: 14/006,033

(22) PCT Filed: Jun. 27, 2011

(86) PCT No.: PCT/US2011/041954
§ 371 (c)(1),
(2), (4) Date: Sep. 18, 2013

(87) PCT Pub. No.: WO2013/002751
PCT Pub. Date: Jan. 3, 2013

(65) Prior Publication Data
US 2014/0009885 A1    Jan. 9, 2014

(51) Int. Cl.
| H05K 7/20 | (2006.01) |
| H05K 5/02 | (2006.01) |
| H01L 23/467 | (2006.01) |
| H01L 23/473 | (2006.01) |

(52) U.S. Cl.
CPC ............ *H05K 5/0213* (2013.01); *H01L 23/467* (2013.01); *H01L 2924/0002* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/136
See application file for complete search history.

(56) References Cited

U.S. PATENT DOCUMENTS

| 6,349,760 | B1 * | 2/2002 | Budelman | ............. H01L 23/427 165/104.33 |
| 6,418,017 | B1 * | 7/2002 | Patel | ....................... G06F 1/203 165/104.33 |
| 6,717,813 | B1 * | 4/2004 | Garner | ................ H01L 23/4093 257/E23.086 |
| 6,999,312 | B1 * | 2/2006 | Garnett | ................. H01L 23/467 165/80.3 |
| 7,255,532 | B2 * | 8/2007 | Zheng | ..................... F04D 17/04 415/183 |
| 7,359,205 | B1 * | 4/2008 | Sun | .......................... G06F 1/20 165/80.2 |

(Continued)

FOREIGN PATENT DOCUMENTS

JP         10012781 A         1/1998

OTHER PUBLICATIONS

Passive BGA Heatsinks; http://www.hellotrade.com/radian-heatsinks-use/passive-bga-heatsinks.html; Jun. 27, 2011.

*Primary Examiner* — Anthony Haughton
*Assistant Examiner* — Razmeen Gafur
(74) *Attorney, Agent, or Firm* — Hewlett Packard Enterprise Patent Department

(57) ABSTRACT

Heat is conducted from a primary component to a thermal dissipation structure. An airflow removes from the thermal dissipation structure. An air channel associated with the thermal dissipation structure diverts a portion of the airflow to a secondary component, thereby providing cooling to the secondary component.

15 Claims, 8 Drawing Sheets

(56) References Cited

U.S. PATENT DOCUMENTS

| | | | |
|---|---|---|---|
| 7,864,527 B1* | 1/2011 | Whitted | H05K 7/20736 165/104.33 |
| 8,456,840 B1* | 6/2013 | Clidaras | H05K 7/20745 165/104.22 |
| 9,075,581 B2* | 7/2015 | Stock | G06F 1/20 |
| 2006/0274504 A1 | 12/2006 | Yao | |
| 2007/0035937 A1* | 2/2007 | Colbert | H01L 23/4006 361/810 |
| 2007/0139886 A1* | 6/2007 | Xia | H01L 23/427 361/700 |
| 2007/0247813 A1 | 10/2007 | Colbert et al. | |
| 2007/0281639 A1* | 12/2007 | Clidaras | G06F 1/20 455/128 |
| 2008/0074845 A1* | 3/2008 | Sun | H01L 23/467 361/712 |
| 2008/0151498 A1 | 6/2008 | Zhang | |
| 2009/0081940 A1* | 3/2009 | Jang | F24F 1/22 454/184 |
| 2009/0244846 A1* | 10/2009 | Tomioka | F28D 15/0266 361/700 |
| 2009/0268403 A1* | 10/2009 | Chen | G06F 1/203 361/692 |
| 2011/0063795 A1* | 3/2011 | Yeh | G06F 1/182 361/679.48 |
| 2011/0081851 A1* | 4/2011 | Franz | H05K 7/20145 454/184 |
| 2011/0222243 A1* | 9/2011 | Nagami | B23K 9/1006 361/697 |
| 2012/0039035 A1* | 2/2012 | Wei | G06F 1/181 361/679.47 |
| 2012/0050991 A1* | 3/2012 | Tamanuki | H01L 23/467 361/697 |
| 2012/0140403 A1* | 6/2012 | Lau | H01L 23/427 361/679.47 |
| 2012/0162919 A1* | 6/2012 | Lin | H01L 23/3675 361/704 |
| 2013/0231039 A1* | 9/2013 | Nagasaka | H05K 5/0213 454/184 |
| 2013/0242542 A1* | 9/2013 | Uchimi | F21V 29/027 362/97.1 |

* cited by examiner

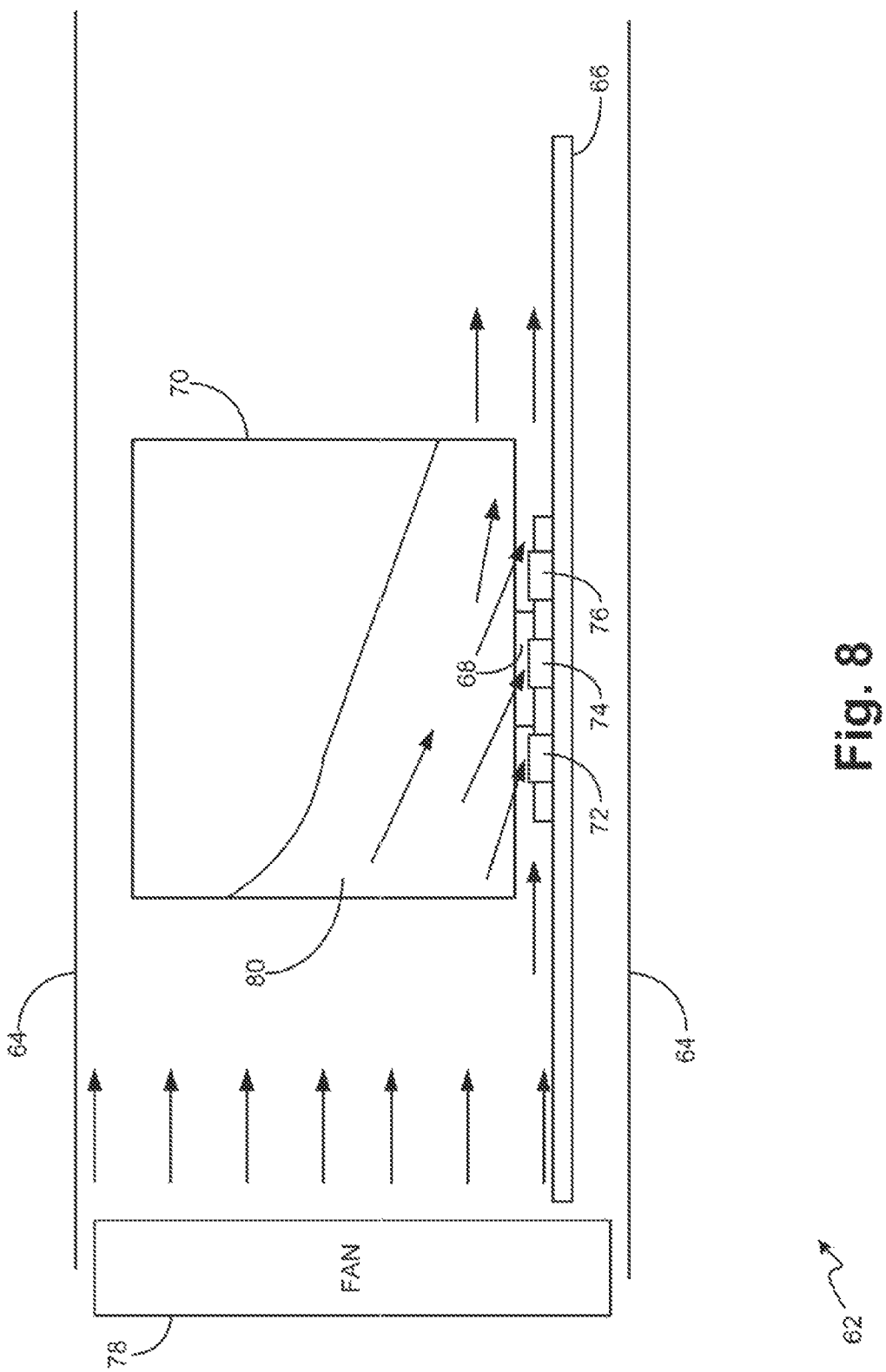

COOLING A SECONDARY COMPONENT BY DIVERTING AIRFLOW USING AN AIR CHANNEL ASSOCIATED WITH A THERMAL DISSIPATION DEVICE THAT COOLS A PRIMARY COMPONENT

BACKGROUND

In the art of electronic systems, it is common to cool an electronic component using a heat sink. Typically a heat sink includes a thermal contact surface that may be thermally coupled to the component, and a thermal dissipation structure that is thermally coupled to the thermal contact surface.

Heat is transferred from the component to the thermal dissipation structure via the thermal contact surface. Typically an airflow is provided that removes heat from the thermal dissipation structure.

BRIEF DESCRIPTION OF THE DRAWINGS

The Figures depict embodiments, implementations, and configurations of the invention, and not the invention itself.

FIG. 8 shows a block diagram of system that illustrates an example for cooling secondary components by diverting airflow downward to the secondary components.

DETAILED DESCRIPTION

In the foregoing description, numerous details are set forth to provide an understanding of the examples disclosed herein. However, it will be understood by those skilled in the art that the examples may be practiced without these details. While a limited number of examples have been disclosed, those skilled in the art will appreciate numerous modifications and variations therefrom. It is intended that the appended claims cover such modifications and variations as fall within the true spirit and scope of the examples.

In the art of electronic systems, including computer system, heat producing components are often thermally coupled to heat sinks. A common example is a central processing unit (CPU) that is thermally coupled to a heat sink. The terms "first" and "primary" will be used to refer to components that are in thermal communication with the heat sink.

Often addition heat producing components are positions proximate of the primary component. The terms "secondary" or "second", "third", "fourth", and so forth will be used to refer to the additional heat producing components.

The primary and secondary components may have independent functions. Alternatively, the primary and secondary components may have an association that is facilitated by close placement of the primary and secondary components. For example, the secondary components could be components that convert, regulate, or condition power that is supplied to the primary components. Similarly, the secondary components perform a signal conversion or driving function, including conversions between photonic (optical) and electrical signals, data latching, and bus drivers.

Figure 1:
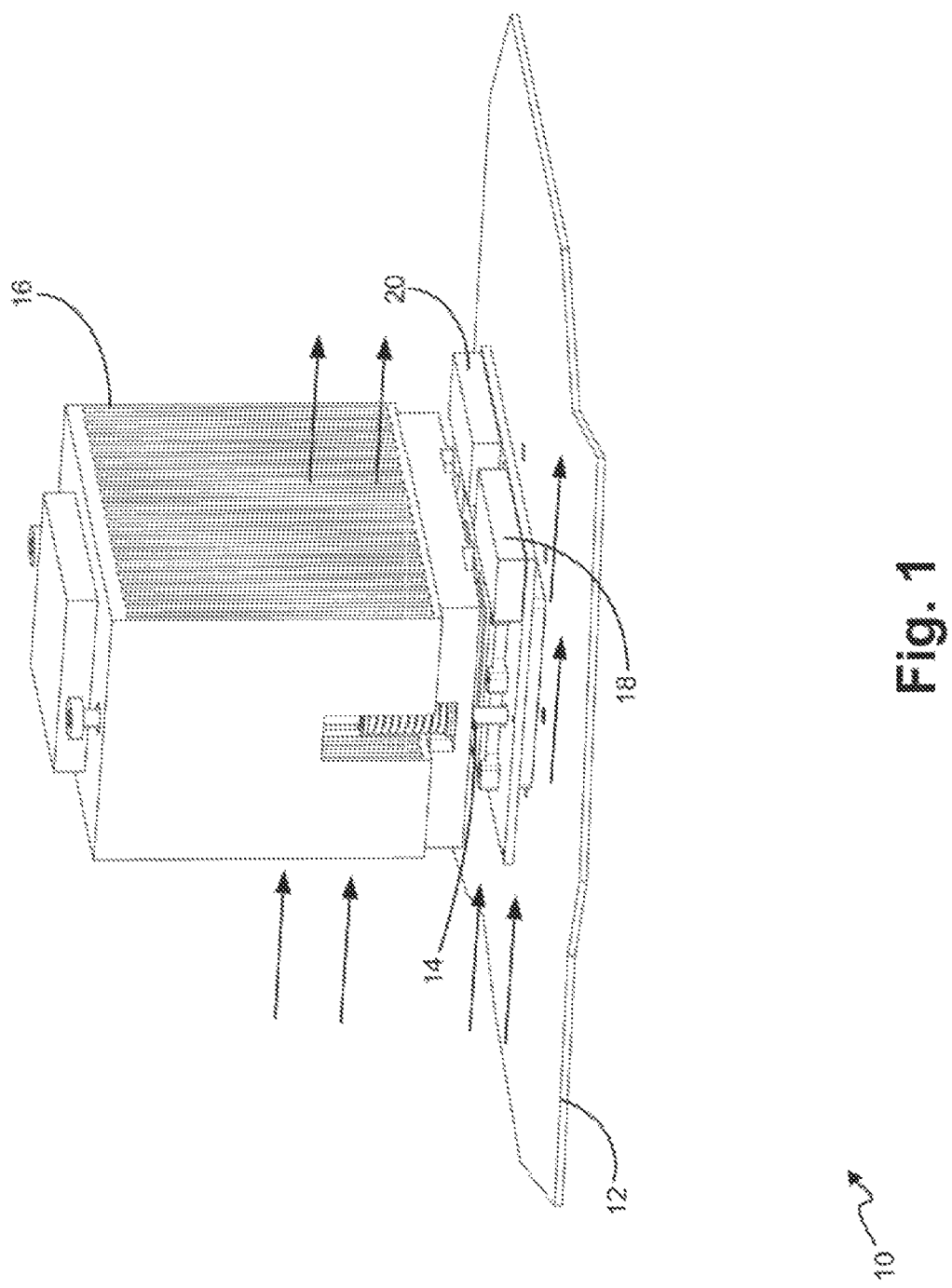
FIG. 1 shows a portion of a system having a mainboard, a primary component, a heat sink, and secondary components.

FIG. 1 shows a portion of a system 10. System 10 includes mainboard 12, primary component 14, heat sink 16, and secondary components 18 and 20. Airflow is provided through heat sink 16 in the direction depicted by the arrows. As can be seen in FIG. 1, primary component 14 and heat sink 16 interfere with airflow over secondary components 18 and 20. Accordingly, the secondary components may not be adequately cooled.

Figure 2:
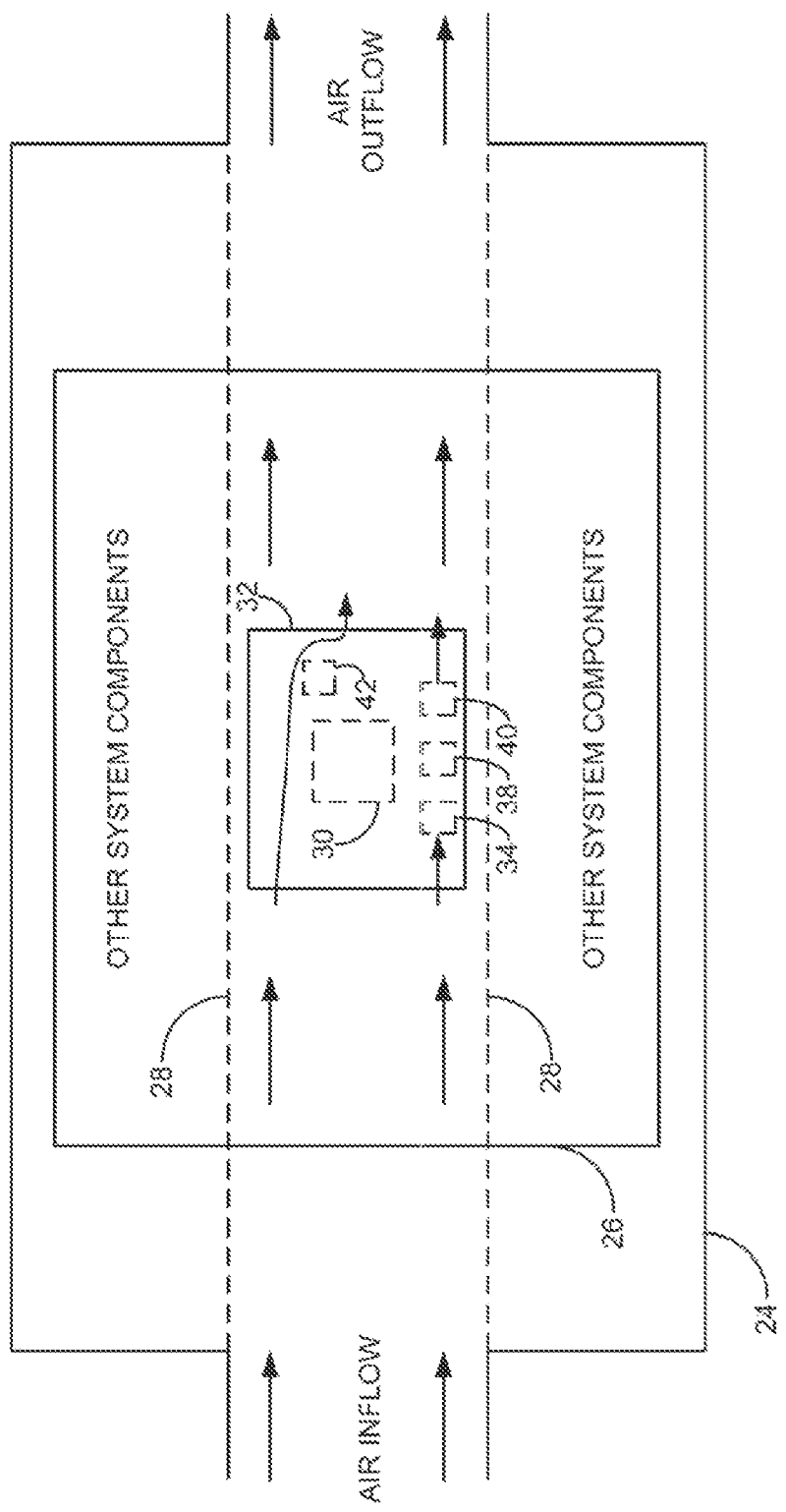
FIG. 2 is a simplified block diagram of a system, and illustrates two examples for cooling secondary components.

FIG. 2 is simplified block diagram of system 22 which illustrates two examples for cooling secondary components. System 22 includes enclosure 24 and mainboard 26. Airflow is provided through enclosure 24, and may be directed via a baffle or ducting system, which is depicted genetically by lines 28. Attached to main board 26 is primary component 30, which is cooled by heat sink 32. Secondary components 34, 38, 40, and 42 are located proximate primary component 30.

Secondary components 34, 38, and 40 are alongside primary component 30. As will be shown in greater detail below, secondary components 34, 38, and 40 are not in direct thermal contact with heat sink 32, but heat sink 32 includes an air channel for diverting cooling airflow downward to secondary components 34, 38, and 40.

Similar to secondary components 18 and 20 shown in FIG. 1, secondary component 42 is positioned partially behind primary component 30 with respect to the primary direction of the airflow. As will be shown in greater detail below, secondary component 42 is not in direct thermal contact with heat sink 32, but heat sink 32 includes an air channel for diverting cooling airflow around primary component 30 to secondary component 42.

Figure 3:
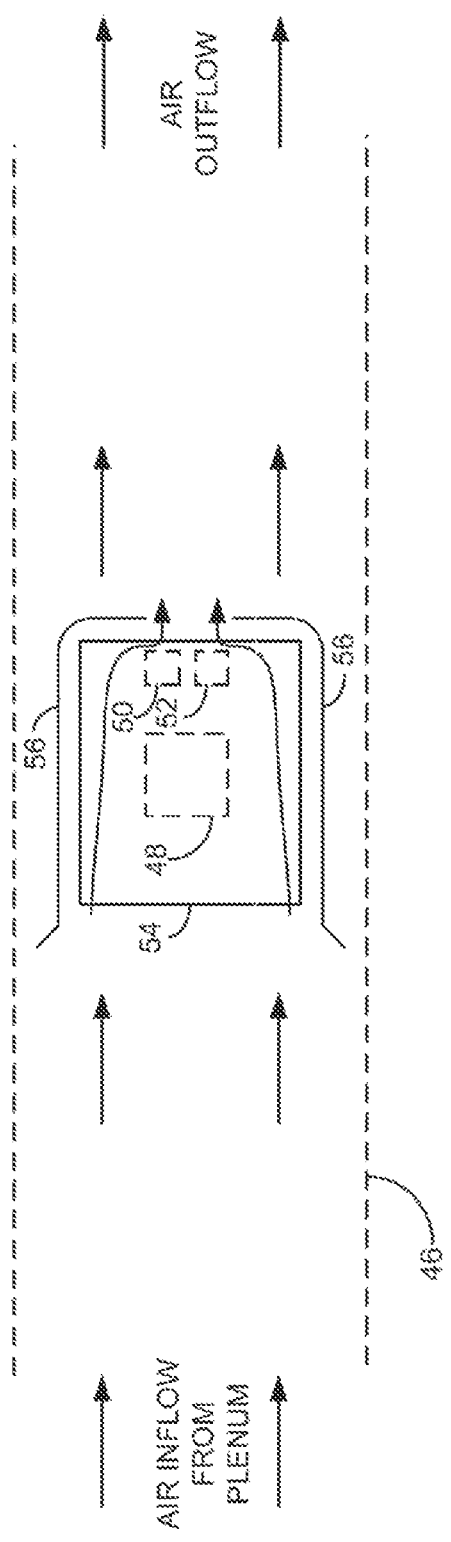
FIG. 3 shows a block diagram of system, illustrates an example for cooling secondary components by diverting airflow around a primary component.

FIG. 3 shows a block diagram of system 44, and illustrates an example for cooling secondary components by diverting airflow around a primary component. System 44 includes a baffle 46 for directing airflow. Primary component 48 and secondary components 50 and 52 are located proximate each other, with secondary components 50 and 52 at least partially behind primary component 48 with respect to the primary direction of airflow through baffle 46.

Associated with heat sink 54 is shroud 56, which is shown more clearly in FIGS. 4-7. Shroud 56 redirects airflow around primary component 48, thereby providing cooling airflow to secondary components 50 and 52.

FIGS. 4-7 are various perspective views of some of the components shown in block diagram form in FIG. 3. Note that the examples shown in FIGS. 4-7, along with examples shown in other figures, show various structures without the other component that would normally be shown in a computer system. As is known in the art, designers need to balance airflow impedance so that all areas needing cooling receive adequate airflow. If a path having high airflow impedance is next to a path having low airflow impedance, union of the airflow will take the low impedance path. A designer implementing the examples disclosed herein would appreciate that necessary ducting, plenums, fans, or other cooling devices required to ensure sufficient airflow into the heat sink structures that divers airflow to the secondary components would need to be provided.

Figure 5:
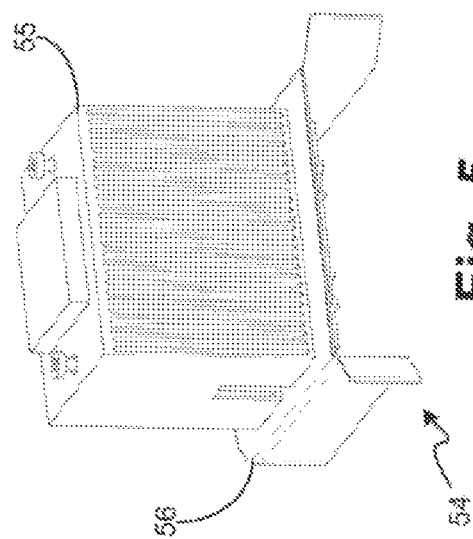
FIG. 5 is a perspective view of the heat sink shown in FIG. 4 taken from above the heat sink.
Figure 4:
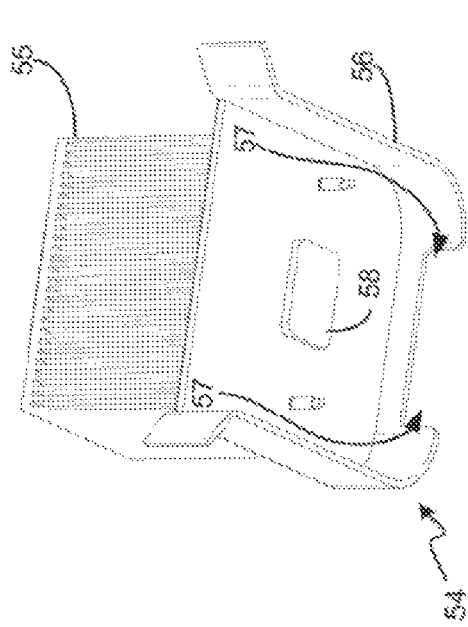
FIG. 4 shows an underside of a heat sink that includes a shroud.

FIG. 4 shows an underside of heat sink 54, including shroud 56. Also shown in FIG. 4 is thermal dissipation structure 55 and thermal contact surface 58. After assembly of system 44 in FIG. 3, primary component 48 is in thermal contact with thermal contact surface 58, which in turn is in thermal contact with thermal dissipation structure 55 to facilitate removal of heat via the airflow. Also visible in FIG. 4 are air channels 57 that are formed after assembly, with the flared air inflow of shroud 56 capturing airflow, and the shape of shroud 56 diverting air around component 48 and thermal contact surface 58, past the secondary components, and exiting the rear of shroud 56. The air channels 57 function as airflow diversion members. FIG. 5 is a perspective view showing heat sink 54 (including shroud 56 and heat dissipation structure 55) from above heat sink 54.

Figure 6:
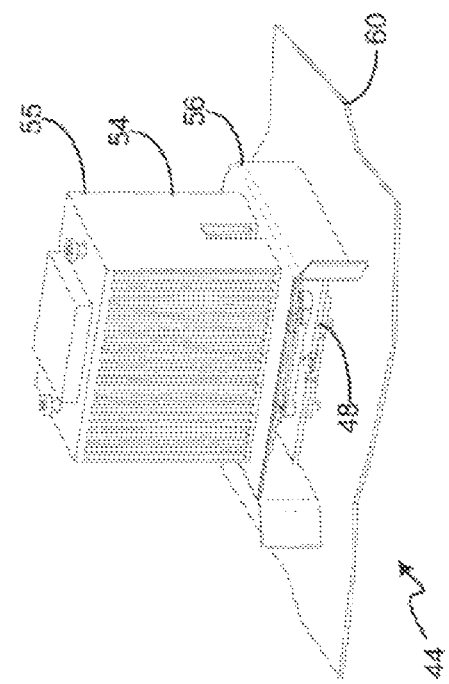
FIG. 6 is a front perspective view of a portion of a system that includes a mainboard to which a primary component is attached and cooled by the heat sink shown in FIGS. 4 and 5.

FIG. 6 is a front perspective view of a portion of system 44. FIG. 6 includes mainboard 60, to which primary component 48 is attached. Heat sink 54 is thermally coupled to primary component 48. FIG. 6 illustrates how the flared air inflow of shroud 56 captures airflow and routes the airflow around component 48.

Figure 7:
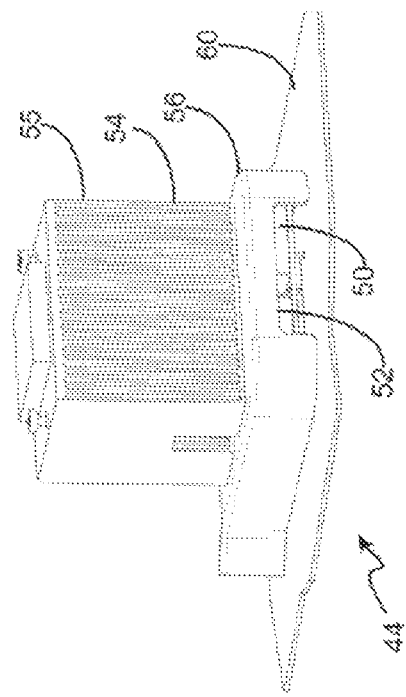
FIG. 7 is a rear perspective view of the portion of the system shown in FIG. 6.

FIG. 7 is a rear perspective view of the portion of system 44 shown in FIG. 6. In FIG. 7, the airflow exit of shroud 56 is shown. Note that the exit is proximate secondary components 50 and 52 from FIG. 3 to concentrate airflow over the secondary component, thereby providing cooling to the secondary components.

Note that shroud 56 may be formed with thermal dissipation structure 55 and thermal contact surface 58 using manufacturing techniques that produce a unitary structure. Alternatively, shroud 56 may be a separate structure. For example, shroud 56 could be implemented as a snap-on component formed from polycarbonate that is attached to thermal structure 55 at any time after thermal structure 55 has been fabricated.

FIG. 8 shows a block diagram of system 62, and illustrates an example for cooling secondary components by diverting airflow downward to the secondary components. System 62 includes enclosure 64. Within enclosure 64 is mainboard 66, upon which is mounted primary component 68, which in is thermal contact with heat sink 70.

Also mounted is mainboard 66 are secondary components 72, 74 and 76, which are not in direct thermal contact with heat sink 70. Heat sink 70 includes air channels 80, which function as airflow diversion members. Fan 78 is provided to generate airflow by creating positive pressure in a primary direction to enclosure 64, and air channels 80 urge airflow downward toward secondary components 72, 74, and 76, thereby providing cooling for the secondary components. Note that fan 78 may also be located on the other side of heat sink 70 to create negative pressure that would cause airflow in the same direction.

Also note that air channel 80 is narrower at the air exit point of heat sink 70 than it is at the air entry point. As the air channel narrows, the velocity of air moving through the air channel increases. The increase in airflow can have a compensation effect since the leading components that encounter the airflow (e.g., component 72) tend to heat the air, but the trailing components that encounter the airflow (e.g., component 76) tend to experience higher airflow velocity.

Figure 10:
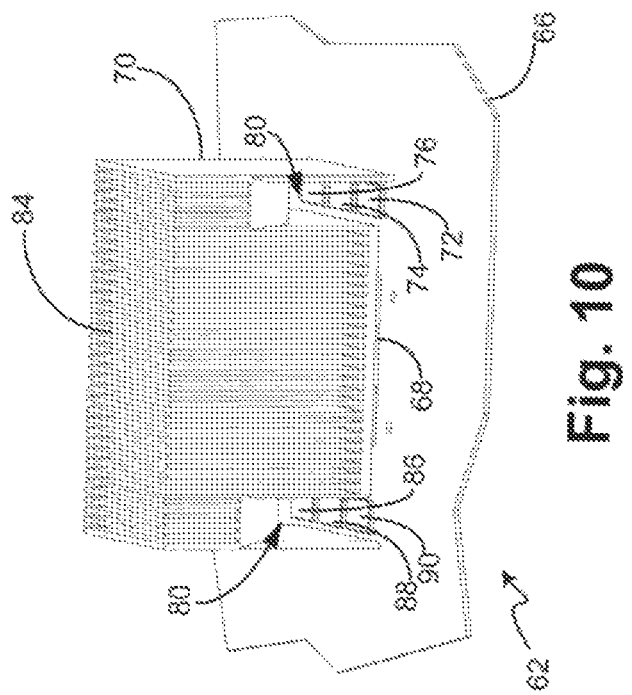
FIG. 10 shows a portion of the system of FIG. 8.
Figure 9:
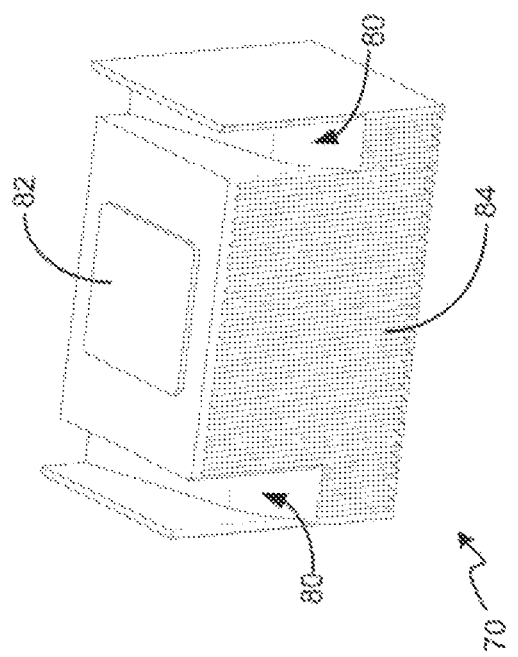
FIG. 9 shows a heat sink that includes a thermal contact surface and a thermal dissipation structure that are in thermal contact with each other.

FIGS. 9 and 10 are perspective views of some of the components shown in block diagram form in FIG. 8. FIG. 9 shows an underside of heat sink 70, which includes thermal contact surface 82 and thermal dissipation structure 84, both of which are in thermal contact with each other. Also included in heat sink 70 are air channels 80, which act as airflow diversions members. Note that the sloped surfaces within air channels 80 will tend to urge airflow toward a plane defined by thermal contact surface 82.

FIG. 10 shows a portion of system 62 of FIG. 8. Note that air channels 80 urge airflow downward toward mainboard 66 to provide cooling for auxiliary components 72, 74, 76, 86, 88, and 90.

Figure 11:
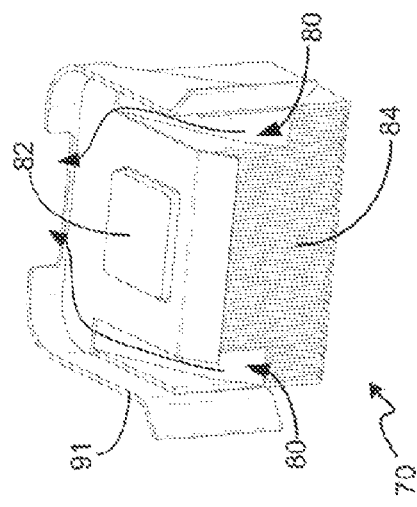
FIGS. 11-14 skew a heat sink that diverts airflow downward to cool secondary components in combination with a shroud that diverts airflow around a primary component to a secondary component.
Figure 12:
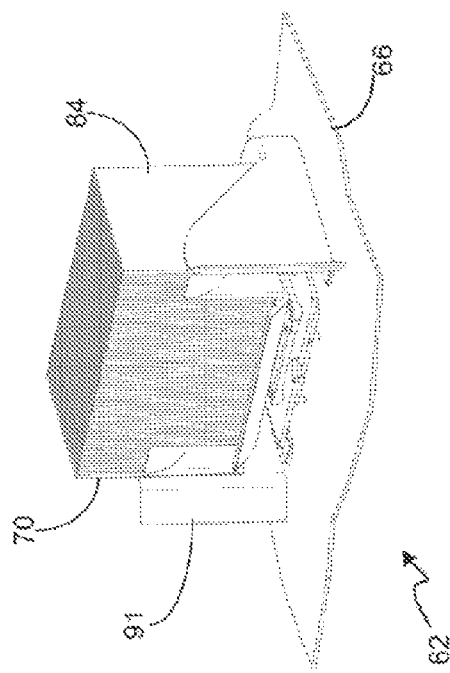
Figure 13:
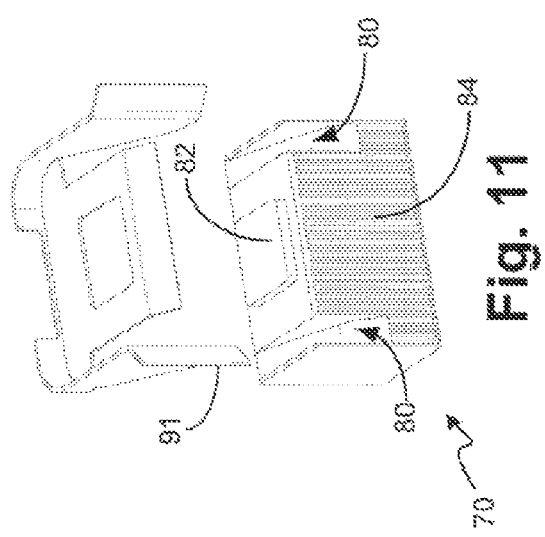
Figure 14:
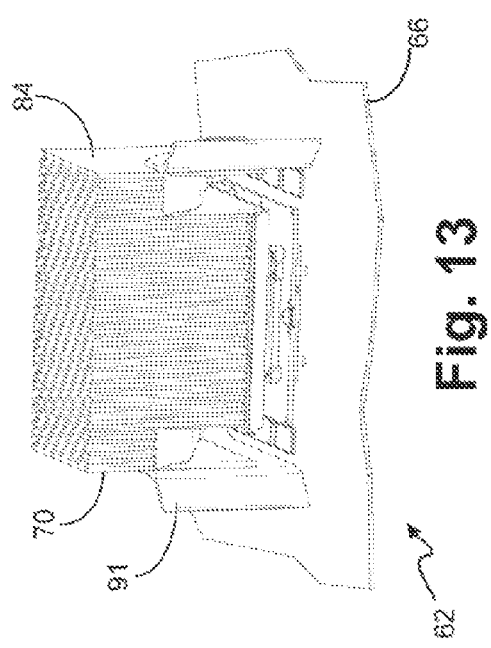

FIGS 11-14 are perspective views that combine heat sink 70 of FIGS. 9 and 10 with a shroud. FIG. 11 is an exploded view showing heat sink 70 and shroud 91, and FIG. 12 shows the heat sink and shroud after initial assembly. FIG. 13 and 14 each show a portion of system 62 with heat sink 70 and shroud 91. Heat sink 70, in combination with shroud 91, provides cooling to secondary components that are alongside the primary component and behind the primary component with respect to the primary direction of airflow through system 62.

Figure 15:
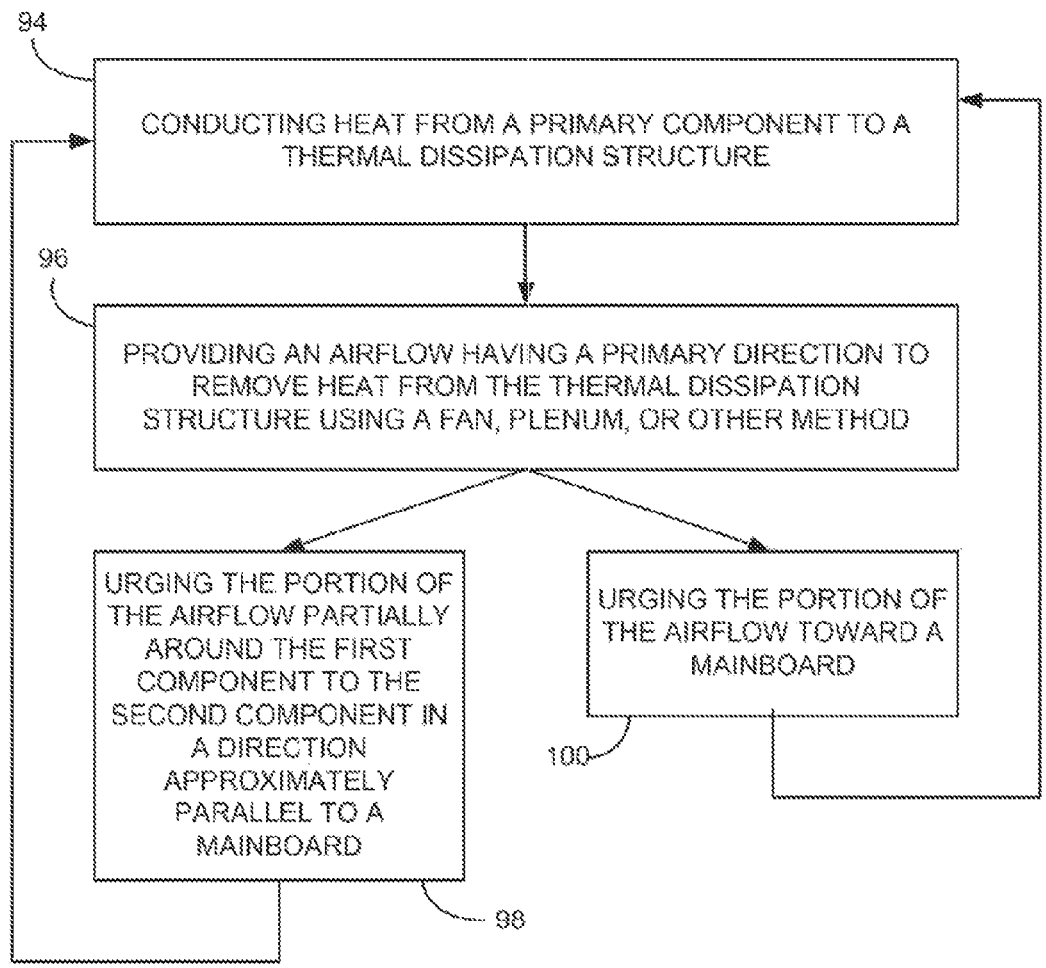
FIG. 15 shows a flowchart that describes an example method for removing heat irons a secondary component.

FIG. 15 shows a flowchart 92 that describes an example method for removing heat from a secondary component. At block 94, heat is conducted away from a primary component to a thermal dissipation structure, Control passes to block 96.

At block 96 an airflow is provided having a primary direction to remove heat from the thermal dissipation structure. The airflow may be provided using a fan, a plenum, or any other method known in the art for supplying an airflow.

In the examples discussed with reference to FIGS. 3-7, control passes to block 98, where the portion of the airflow is urged partially around the first component to the second component in a direction approximately parallel to a mainboard, and control passes back to block 94 and the method repeats. In the examples discussed with reference to FIGS. 8-10, control passes from block 96 to block 100, and the portion of the airflow is urged downward toward a mainboard to cool the secondary component. In the examples discussed with reference to FIGS. 11-14, control passes to both blocks 98 and 100. Control then passes back to block 94 and the method repeats.

The examples disclosed herein allow secondary components to be cooled by diverting airflow at a heat sink provided to cool a primary component. Various electronic designs may employ secondary components capable of generating significant heat, such as electrical to photonic (optical) signal converters. The disclosed examples allow such secondary components to be cooled using diversion mechanisms that incur little additional cost.

In the foregoing description, numerous details are set forth to provide an understanding of the examples disclosed herein. However, it will be understood by those skilled in the art that the examples may be practiced without these details. While a limited number of examples have been disclosed, those skilled in the art will appreciate numerous modifications and variations therefrom. It is intended that the appended claims cover such modifications and variations as fall within the true spirit and scope of the disclosed examples.

What is claimed is:
1. A heat sink for cooling a first component comprising:
    a thermal contact surface for conducting heat from the first component;
    a thermal dissipation structure for conducting heat away from the thermal contact surface and dissipating heat into a directed airflow; and an air channel for diverting a portion of the directed airflow toward a second component to cool the second component, wherein the second component is not in direct thermal contact with the thermal contact surface or the thermal dissipation structure when the heat sink is deployed, and wherein an internal diameter of the air channel is comparatively narrower at an air exit point than an internal diameter of an air entry point of the heat sink to increase a velocity of the portion of the directed airflow at the air exit point relative to a velocity of the directed airflow at the air entry point.

2. The heat sink of claim 1 wherein the thermal contact surface defines a plane, and the air channel tends to urge the portion of the directed airflow toward the plane.

3. The heat sink of claim 1 wherein the directed airflow has a primary direction, the first component tends to obstruct airflow to the second component along the primary direction, and the air channel tends to urge the portion of the directed airflow partially around the first component to the second component.

4. A system comprising:
an enclosure, wherein a cooling airflow having a primary direction may be maintained within the enclosure during operation of the system;
a mainboard in the enclosure;
first and second components mounted to the mainboard; and
a heat sink comprising:
  a surface in thermal contact with the first component;
  a thermal dissipation structure for conducting heat away from the surface and dissipating heat into the cooling airflow; and
  an airflow diversion member that urges a portion of the airflow toward the second component to cool the second component, and wherein an internal diameter of the airflow diversionary member is comparatively narrower at an air exit point than an internal diameter of an air entry point of the heat sink to increase a velocity of the portion of the directed airflow at the air exit point relative to a velocity of the directed airflow at the air entry point.

5. The system of claim 4 wherein the second component is behind the first component with respect to the primary direction, and the airflow diversion member comprises a shroud that urges the portion of the airflow along a path approximately parallel to the mainboard and partially around the first component to the second component.

6. The system of claim 4 wherein the airflow diversion member has a sloped surface with respect to the mainboard that urges the portion of the airflow toward the second component.

7. The system of claim 6 wherein the sloped surface is integrated into the thermal dissipation structure.

8. The system of claim 4 wherein the first component has an association with the second component that is facilitated by close placement of the first component and the second component.

9. The system of claim 4 wherein the cooling airflow is created by at least one fan within the enclosure.

10. The system of claim 4 wherein the cooling airflow is created by a plenum that supplies air to the enclosure.

11. A method of cooling components comprising:
conducting heat from a primary component to a thermal dissipation structure;
providing an airflow having a primary direction to remove heat from the thermal dissipation structure; and
diverting a portion of the airflow toward a secondary component using an air channel associated with the thermal dissipation structure to provide a velocity of the portion of the airflow at an air exit point of the air channel that is relatively greater than a velocity of the portion of the airflow at an air entry point of the air channel.

12. The method of claim 11 wherein diverting a portion of the airflow toward a secondary component using an air channel associated with the thermal dissipation structure includes urging the portion of the airflow partially around the first component to the second component in a direction approximately parallel to a mainboard.

13. The method of claim 11 wherein diverting a portion of the airflow toward a secondary component using an air channel associated with the thermal dissipation structure includes urging the portion of the airflow toward a mainboard.

14. The method of claim 11 wherein the first component has an association with the second component that is facilitated by close placement of the first component and the second component.

15. The method of claim 11 wherein providing an airflow having a primary direction to remove heat from the thermal dissipation structure comprises operating at least one cooling fan.

* * * * *